(12) United States Patent
Lanzillo et al.

(10) Patent No.: US 10,741,751 B2
(45) Date of Patent: Aug. 11, 2020

(54) FULLY ALIGNED SEMICONDUCTOR DEVICE WITH A SKIP-LEVEL VIA

(71) Applicant: International Business Machines Corporation, Armonk, NY (US)

(72) Inventors: Nicholas A. Lanzillo, Troy, NY (US); Benjamin D. Briggs, Waterford, NY (US); Chih-Chao Yang, Glenmont, NY (US); Hsueh-Chung Chen, Cohoes, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/596,152

(22) Filed: Oct. 8, 2019

(65) Prior Publication Data

US 2020/0136028 A1 Apr. 30, 2020

Related U.S. Application Data

(62) Division of application No. 16/173,234, filed on Oct. 29, 2018, now Pat. No. 10,553,789.

(51) Int. Cl.
| | |
|---|---|
| *H01L 29/82* | (2006.01) |
| *H01L 43/12* | (2006.01) |
| *H01L 27/22* | (2006.01) |
| *H01L 43/02* | (2006.01) |
| *H01L 43/10* | (2006.01) |

(52) U.S. Cl.
CPC ............ *H01L 43/12* (2013.01); *H01L 27/222* (2013.01); *H01L 43/02* (2013.01); *H01L 43/10* (2013.01)

(58) Field of Classification Search
CPC ..................................................... H01L 27/222
See application file for complete search history.

(56) References Cited

U.S. PATENT DOCUMENTS

| | | | |
|---|---|---|---|
| 5,691,238 A | 11/1997 | Avanzino et al. | |
| 7,993,535 B2 | 8/2011 | Jiang et al. | |
| 8,357,609 B2 | 1/2013 | Ryan | |
| 8,477,529 B2 | 7/2013 | Keshtbod et al. | |
| 9,041,146 B2 | 5/2015 | Lee et al. | |
| 9,373,782 B2 | 6/2016 | Li et al. | |
| 9,613,861 B2 | 4/2017 | Anderson et al. | |

(Continued)

FOREIGN PATENT DOCUMENTS

WO 2015026390 A1 2/2015

OTHER PUBLICATIONS

List of IBM Patents or Patent Applications Treated as Related.

*Primary Examiner* — Samuel A Gebremariam
(74) *Attorney, Agent, or Firm* — Vazken Alexanian; Ryan, Mason & Lewis, LLP

(57) ABSTRACT

A semiconductor structure includes a memory element disposed on a first metal layer. A first cap layer is disposed on the first metal layer and sidewalls of the memory element. A first dielectric layer is disposed on a top surface of the first cap layer on the first metal layer and a portion of the first cap layer on the sidewalls of the memory element. A second metal layer is disposed on the first dielectric layer and sidewalls of the first cap layer. A second cap layer is disposed on a top surface of the second metal layer. A second dielectric layer is disposed on the second cap layer. A via is in the second dielectric layer and exposes a top surface of the memory element. A third metal layer is disposed on the second dielectric layer and in the via.

20 Claims, 5 Drawing Sheets

(56) References Cited

U.S. PATENT DOCUMENTS

| | | |
|---|---|---|
| 9,634,250 B2 | 4/2017 | Greeley et al. |
| 9,865,649 B2 | 1/2018 | Tan et al. |
| 9,941,470 B2 | 4/2018 | Yang et al. |
| 2001/0050385 A1 | 12/2001 | Kotecki et al. |
| 2008/0247214 A1 | 10/2008 | Ufert |
| 2012/0080793 A1 | 4/2012 | Danek et al. |
| 2013/0017627 A1 | 1/2013 | Keshtbod et al. |
| 2013/0119494 A1 | 5/2013 | Li et al. |
| 2014/0264679 A1 | 9/2014 | Lee et al. |
| 2015/0056722 A1 | 2/2015 | Li et al. |
| 2016/0315258 A1 | 10/2016 | Greeley et al. |
| 2017/0092693 A1 | 3/2017 | Tan et al. |
| 2017/0207387 A1 | 7/2017 | Yang et al. |
| 2017/0317143 A1 | 11/2017 | Chen et al. |

FULLY ALIGNED SEMICONDUCTOR DEVICE WITH A SKIP-LEVEL VIA

BACKGROUND

This disclosure relates generally to a semiconductor structure, and particularly to a semiconductor structure including a non-volatile semiconductor memory device that employs a skip level via, and a method of manufacturing the same.

Memory devices are used in a wide range of fields. For example, memory devices can be used in consumer, industrial, military, aeronautical and space applications. Memory devices may be composed of non-volatile memory or volatile memory. Many types of non-volatile memories are known in the art such as, for example, magnetoresistive random-access memory (MRAM), phase change memory (PCM), and resistive random-access memory (ReRAM), among others.

SUMMARY

According to an exemplary embodiment of the present invention, a method for fabricating a semiconductor device includes forming a semiconductor structure. The method comprises forming a memory element on a first metal layer. The method further comprises forming a first cap layer on the first metal layer and sidewalls of the memory element. The method further comprises forming a first dielectric layer on a top surface of the first cap layer on the first metal layer and a portion of the first cap layer on the sidewalls of the memory element. The method further comprises forming a second metal layer on the first dielectric layer to form a planarized top surface with the first cap layer and memory element. The method comprises selectively removing a portion of the memory element and forming an opening. The method further comprises selectively depositing a second cap layer on the planarized top surface of the second metal layer. The method further comprises depositing a second dielectric layer on the second cap layer and filling the opening. The method further comprises selectively etching a via in the second dielectric layer and exposing a top surface of the memory element. The method further comprises depositing a third metal layer on the second dielectric layer and filling the via.

According to an exemplary embodiment of the present invention, a semiconductor structure includes a memory element disposed on a first metal layer. The semiconductor structure further comprises a first cap layer disposed on the first metal layer and sidewalls of the memory element. The semiconductor structure further comprises a first dielectric layer disposed on a top surface of the first cap layer on the first metal layer and a portion of the first cap layer on the sidewalls of the memory element. The semiconductor structure further comprises a second metal layer disposed on the first dielectric layer and sidewalls of the first cap layer. The semiconductor structure further comprises a second cap layer disposed on a top surface of the second metal layer. The semiconductor structure further comprises a second dielectric layer disposed on the second cap layer. The semiconductor structure further comprises a via in the second dielectric layer and exposes a top surface of the memory element. The semiconductor structure further comprises a third metal layer disposed on the second dielectric layer and in the via.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
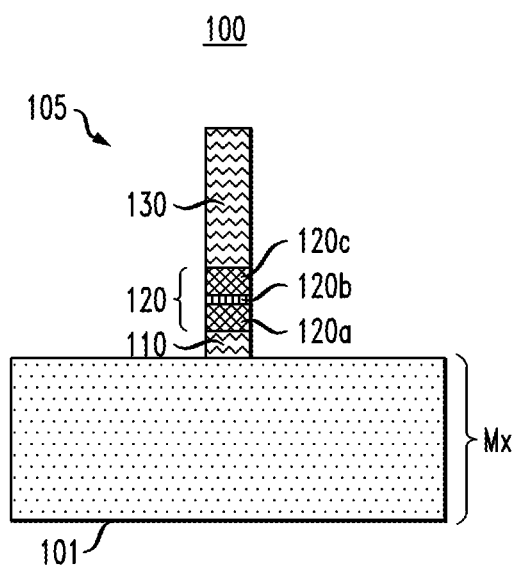
FIG. 1 is a cross-sectional view illustrating fabrication of a memory device layer on a first metal layer for use in a method of manufacturing a semiconductor device, according to an exemplary embodiment of the present invention.

Exemplary embodiments of the invention will now be discussed in further detail with regard to semiconductor structures and a method of manufacturing the semiconductor structures in an integrated circuit (IC), and more particularly to a semiconductor structure including a non-volatile semiconductor memory device that employs a skip level via. Such devices can include Artificial Intelligence (AI) devices. In manufacturing conventional semiconductor structures including a non-volatile semiconductor memory device, the integration of high density devices (e.g., MRAM, PCM, ReRAM) could result in a via landing problem during fabrication as a via etch is difficult to control. For example, it is difficult to make a clean electrical contact between a via and the interconnect line below as the via is often misaligned with respect to the line below, resulting in high electrical resistance. Accordingly, embodiments of the present invention correspond to semiconductor structures in which a memory element is contained in a skip-level via, and the upper-most metal level is fully-aligned to the memory element. In addition, the placement of a memory element in a skip-level via also offers increased design flexibility.

It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. Also, in the figures, the illustrated scale of one layer, structure, and/or region relative to another layer, structure, and/or region is not necessarily intended to represent actual scale.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Illustrative embodiments for forming a semiconductor structure will be described below with reference to FIGS. 1-9. By way of an example as well as for purposes of illustration, the semiconductor structure as presented in this disclosure includes a memory element of a MRAM device. The memory device includes a memory element having a magnetic tunnel junction (MTJ) element formed between a top and bottom electrode. In such case, the MTJ stack layers may correspond to the device layer while the top and bottom electrodes may correspond to the top and bottom terminals which provide a conducting path for the device element. Embodiments of the present disclosure as will be described later allow reliable insertion of the MTJ stack layers and metallization layers employing a skip level via.

It is understood that embodiments of the present disclosure are also applicable to other suitable types of memory elements such as PCM and ReRAM or other suitable types of memory elements. Such memory devices together with logic components are generally based on any suitable technology node. The memory device together with the logic components can be incorporated into standalone memory devices including, but not limited to, Universal Serial Bus (USB) or other types of portable storage units, or ICs, such as microcontrollers or system on chips (SoCs). In addition, the semiconductor structures and ICs and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

For example, according to a first illustrative embodiment, FIG. 1 illustrates a schematic cross-sectional side view of a semiconductor device 100 for use in forming a memory element in a skip-level via in a semiconductor structure. Although FIG. 1 shows only one memory element, it is contemplated that the semiconductor device 100 can contain a plurality of memory elements and corresponding vias as discussed below. For the purpose of clarity, several fabrication steps leading up to the production of semiconductor device 100 as illustrated in FIG. 1 are omitted. In other words, semiconductor device 100 does not necessarily start out in the form illustrated in FIG. 1, but may develop into the illustrated structure over one or more well-known processing steps which are not illustrated but are well-known to those of ordinary skill in the art.

As shown in FIG. 1, the semiconductor device 100 comprises a metal layer 101. The metal layer 101 includes a conductive material. The conductive material includes, for example, aluminum (Al), tungsten (W), copper (Cu) or cobalt (Co) or other suitable types of conductive material. The thickness of the metal layer 101 can range from about 10 nm to about 50 nm. Other suitable thickness dimensions may also be useful, depending on the design requirements of a technology node.

Although not shown, semiconductor device 100 can be part of a front end of line (FEOL) device. The FEOL device, for example, can contain n-type and p-type devices or transistors as well as other regions on the substrate. The p-type and n-type device can form a complementary MOS (CMOS) device. The FEOL device, for example, includes isolation regions, various device and isolation wells, transistor gates and transistor source/drain (S/D) regions and contact or diffusion regions serving as substrate or well taps.

As one skilled in the art will understand, the metal layer 101 of which memory element 105 is disposed thereon may be part of an interlevel dielectric (ILD) level referred to as a first ILD level and its metal level may be referred to as Mx (x=1, 2, 3, etc.). The immediate ILD level overlying the metal level Mx may be referred to as a second ILD level which includes metal level Mx+1 and the next overlying ILD level may be referred to as a third ILD level having metal level Mx+2, etc. Accordingly, a skip level via as used herein connects two non-adjacent metal levels. For example, a skip level via can connect first ILD level and its metal level Mx with third first ILD level and its metal level Mx+2 and via level Vx.

The memory element 105 of semiconductor device 100 includes first and second electrodes. The first electrode, for example, may be a bottom electrode 110 while the second electrode may be a top electrode 130. The bottom electrode 110 of the memory element 105 is connected to the metal layer 101.

The memory element 105 of semiconductor device 100 further includes a MTJ stack 120 disposed in between the bottom electrode 110 and top electrode 130. The memory element 105, for example, may include a bottom-pinned MTJ element or a top-pinned MTJ element. The bottom-pinned MTJ element is formed by having the magnetically fixed layer disposed below the magnetically free layer while the top pinned MTJ element is formed by having the fixed layer disposed above the free layer. For purposes of illustration, the MTJ stack includes three layers. It is understood that the MTJ stack may include other suitable number of layers. The MTJ stack 120 generally includes a magnetically fixed (pinned) layer 120a, one or more tunneling barrier layers 120b and a magnetically free layer 120c. The fixed layer can include, for example, a magnetic layer and a pinning layer. The pinning layer, for example, pins the magnetization direction of the magnetic layer, forming a pinned layer.

By way of example, the free layer 120c and the fixed layer 120a may be a material such as CoFeB or CoFe based composite material. In addition, tunneling barrier layer 120b may be, for example, MgO or $Al_2O_3$. The pinning layer, if used, may be PtMn or IrMn. In one embodiment, the top and bottom electrodes 110 and 130 may be, for example, Ti, TiN, Ta, TaN or other suitable metals used in the semiconductor process. Other suitable configurations or materials of memory element may also be useful.

The top electrode 130, in one embodiment, is disposed over the layers of the MTJ stack 120. The layers of the MTJ stack 120 of the memory element 105 may have, for example, sidewalls that are aligned with each other and include a length dimension which is smaller than a length dimension of the bottom electrode 110. In other embodiments which are not shown herein, the upper layers of the MTJ stack of the memory cell may have a length dimension which is smaller than a length dimension of the lower layers of the MTJ stack and bottom electrode. Other suitable configurations for the top electrode and MTJ stack may also be useful.

Figure 2:
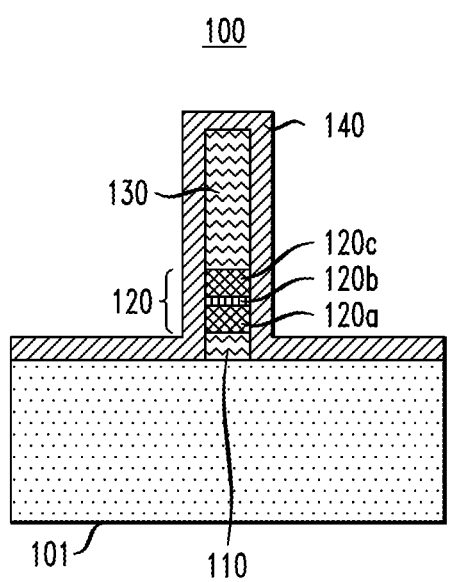
FIG. 2 is a cross-sectional view illustrating a semiconductor device after a first cap layer deposition in a method of manufacturing a semiconductor device, according to an exemplary embodiment of the present invention.

FIG. 2 illustrates the semiconductor device 100 at an intermediate stage of fabrication after a first cap layer deposition in a method of manufacturing a semiconductor structure, according to an exemplary embodiment of the present invention. A first cap layer 140 overlies the top surface of first metal layer 101 and memory element 105. The first cap layer 140 can be any suitable dielectric layer. In one embodiment, first cap layer 140 is a dielectric layer such as a nitrogen and hydrogen doped silicon carbide (SiCN(H)) (also referred to as NBLoK) layer, a carbon doped silicon nitride layer, an aluminum nitride (AlN) layer, and a silicon nitride layer. In one embodiment, first cap layer 140 can have a thickness ranging from about 3 to about 20 nanometers (nm). The first cap layer 140 may be conformally deposited using known methods such as, for example, atomic layer deposition (ALD), chemical vapor deposition (CVD), physical vapor deposition (PVD), electroplating, or electroless plating.

Figure 3:
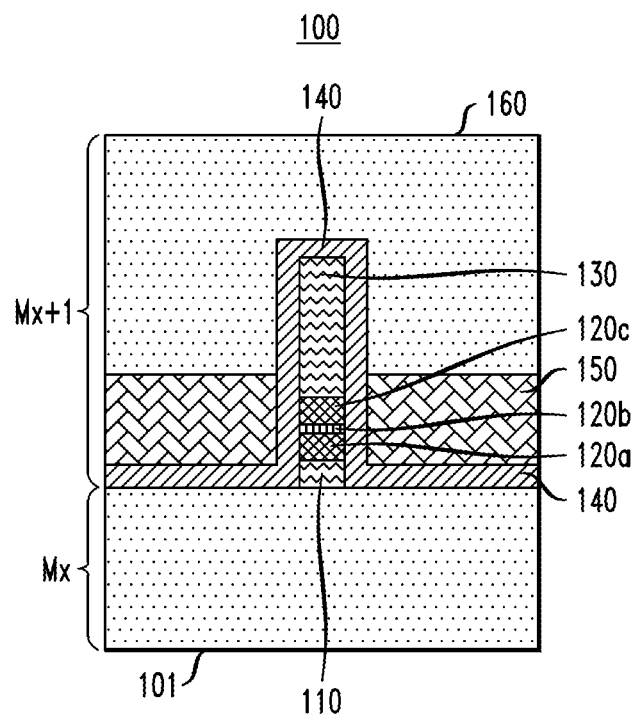
FIG. 3 is a cross-sectional view illustrating a semiconductor device after a first dielectric layer and second metal layer deposition in a method of manufacturing a semiconductor device, according to an exemplary embodiment of the present invention.

FIG. 3 is a cross-sectional view illustrating a semiconductor structure after a first dielectric layer and second metal layer deposition in a method of manufacturing a semiconductor device, according to an exemplary embodiment of the present invention. As shown in FIG. 3, a first dielectric layer 150 is deposited on the top surface of cap layer 140 on metal layer 101 and on a portion of cap layer 140 on the sidewalls of memory element 105. First dielectric layer 150 includes, for example, any suitable low-k dielectric material such as, for example, silicon oxide, hydrogenated silicon carbon oxide (SiCOH), SiCH, SiCNH, or other types of silicon based low-k dielectrics (e.g., k less than about 4.0), porous dielectrics, or known ultra-low-k (ULK) dielectric materials (e.g., k less than about 2.5). The first dielectric layer 150 may be conformally deposited using known methods such as, for example, ALD, CVD, PVD, electroplating, or electroless plating.

Second metal layer 160 is deposited on the top surface of first dielectric layer 150 and over the exposed surface of first cap layer 140. Second metal layer 160 can be formed of the same metal as metal layer 101 or any other suitable metal known in the art. The second metal layer 160 may be formed by, for example, plating such as electroplating, or electroless plating. As discussed above with respect to first ILD level and its metal level referred to as Mx, the immediate ILD level overlying the metal level Mx may be referred to as a second ILD level which includes metal level Mx+1. As shown, first cap layer 140, first dielectric layer 150 and second metal layer 160 form the second ILD level and includes metal level Mx+1.

Figure 4:
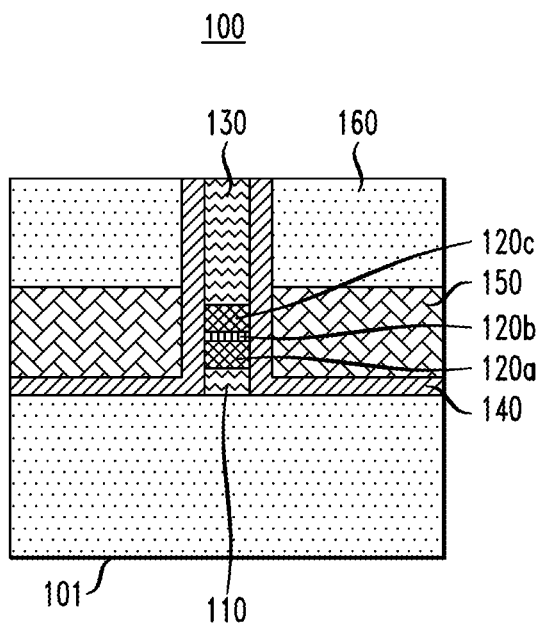
FIG. 4 is a cross-sectional view illustrating a semiconductor device after planarization in a method of manufacturing a semiconductor device, according to an exemplary embodiment of the present invention.

FIG. 4 is a cross-sectional view illustrating a semiconductor structure after planarization in a method of manufacturing a semiconductor device, according to an exemplary embodiment of the present invention. As shown in FIG. 4, second metal layer 160 is subjected to a planarizing process such as a chemical mechanical planarization (CMP) operation. The CMP removes the cap layer 140 on the top surface of memory element 105 and exposes the top surface top electrode 130.

Figure 5:
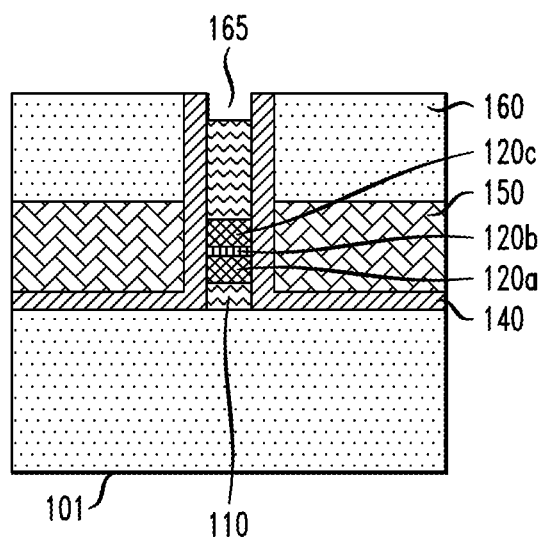
FIG. 5 is a cross-sectional view illustrating a semiconductor device after recessing a portion of the memory device in a method of manufacturing a semiconductor device, according to an exemplary embodiment of the present invention.

FIG. 5 illustrates the semiconductor device 100 at an intermediate stage of fabrication after recessing a portion of the memory element in a method of manufacturing a semiconductor device, according to an exemplary embodiment of the present invention. As shown in FIG. 5, a portion of top electrode 130 is selectively removed to form opening 165 in memory element 105. The opening 165 may be formed by mask and etch techniques. For example, a patterned photoresist mask (not shown) may be formed over the metal layer 160, serving as an etch mask. An etch, such as reactive ion etching (RIE) or wet chemistry, may be performed to selectively recess a portion of top electrode 130 to form opening 165.

Figure 6:
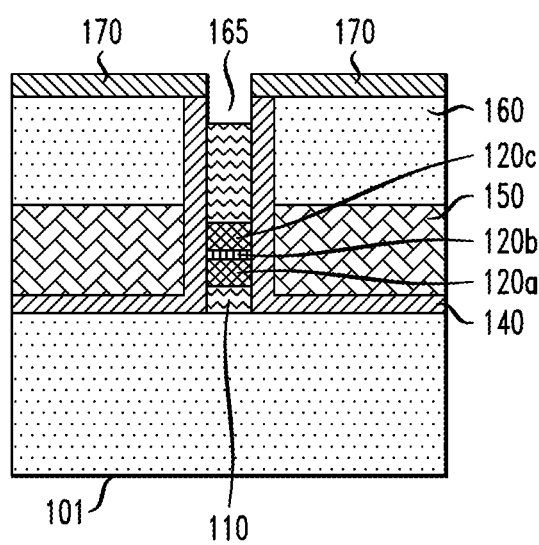
FIG. 6 is a cross-sectional view illustrating a semiconductor device after selective second cap layer deposition in a method of manufacturing a semiconductor device, according to an exemplary embodiment of the present invention.

FIG. 6 illustrates the semiconductor device 100 at an intermediate stage of fabrication after selective second cap layer deposition in a method of manufacturing a semiconductor device, according to an exemplary embodiment of the present invention. As shown in FIG. 6, a second cap layer 170 is deposited on the top surface of second metal layer 160. The second cap layer 170 can comprise any of the materials discussed above for first cap layer 140. The second cap layer 170 can be formed by a deposition process including, for example, CVD, PECVD, ALD, PVD, sputtering, chemical solution deposition and plating.

Figure 7:
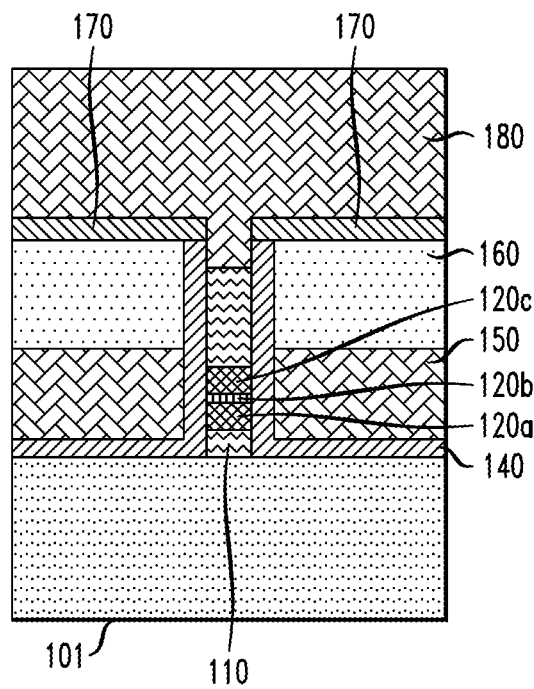
FIG. 7 is a cross-sectional view illustrating a semiconductor device after a second dielectric layer deposition in a method of manufacturing a semiconductor device, according to an exemplary embodiment of the present invention.

FIG. 7 is a cross-sectional view illustrating a semiconductor structure after a second dielectric layer deposition in a method of manufacturing a semiconductor device, according to an exemplary embodiment of the present invention. As shown in FIG. 7, a second dielectric layer 180 is deposited in opening 165 and on the top surface of second cap layer 170. The second dielectric layer 180 can comprise any of the materials discussed above for first dielectric layer 150. The second dielectric layer 180 can be formed by a deposition process including, for example, CVD, PECVD, ALD, PVD, sputtering, chemical solution deposition and plating. The second dielectric layer 180 will be of a sufficient thickness for forming a via as discussed below.

Figure 8:
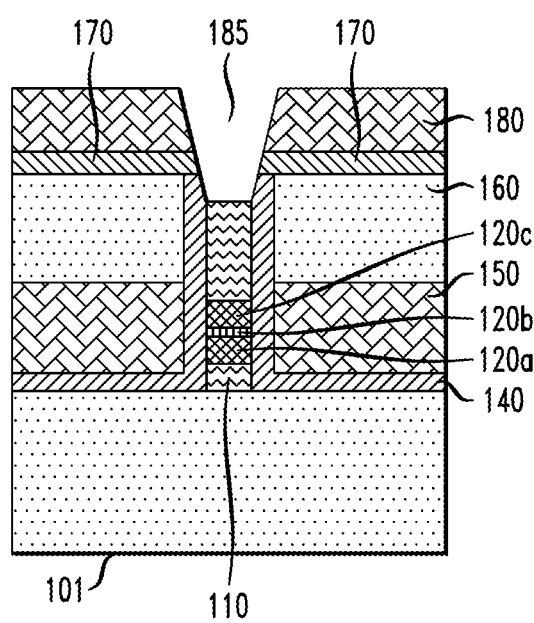
FIG. 8 is a cross-sectional view illustrating a semiconductor device after via formation in a method of manufacturing a semiconductor device, according to an exemplary embodiment of the present invention.

FIG. 8 is a cross-sectional view illustrating a semiconductor structure after via formation in a method of manufacturing a semiconductor device, according to an exemplary embodiment of the present invention. As shown in FIG. 8, via 185 is formed by, for example, mask and etch techniques. For example, a patterned photoresist mask may be formed over the second dielectric layer 180, serving as an etch mask. An etch, such as RIE, may be performed to pattern the second dielectric layer 180 using the patterned resist etch mask to form the via 185. As shown, the etch stops when it reaches a top surface of top electrode 130 in memory element 105. The top electrode 130, for example, serves as an etch stop for the via 185. The shape of the via opening, for example, may have a tapered shape. Other shapes for the opening may also be useful. A CMP is then performed to remove excess second dielectric layer 180 such that the via 185 is of sufficient dimension, e.g., a length ranging from about 20 nm to about 100 nm.

Figure 9:
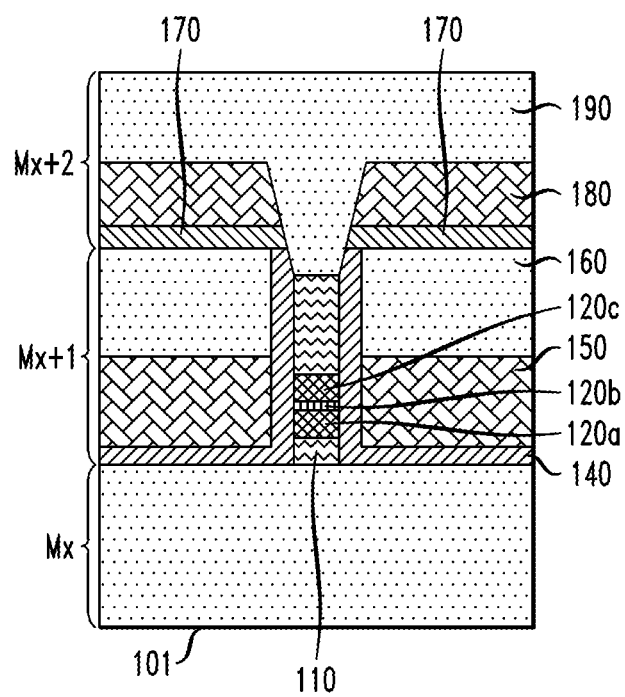
FIG. 9 is a cross-sectional view illustrating a semiconductor device after a third metal layer deposition in a method of manufacturing a semiconductor device, according to an exemplary embodiment of the present invention.

FIG. 9 is a cross-sectional view illustrating a semiconductor structure after metallization material deposition in a method of manufacturing a semiconductor device, according to an exemplary embodiment of the present invention. As shown in FIG. 9, a third metal layer 190 is deposited on the top surface of second dielectric layer 180 and fills via 185. Third metal layer 190 can be formed of the same metal as first and second metal layers 101 and 160 or any other suitable metal known in the art. The third metal layer 190 may be formed by, for example, plating such as electroplating, or electroless plating. As discussed above with respect to first ILD level and its metal level referred to as Mx, the immediate ILD level overlying the second metal level Mx+1 may be referred to as a third ILD level which includes metal level Mx+2. As shown, second cap layer 170, second dielectric layer 180 and third metal layer 190 form the third ILD level and include metal level Mx+2.

The method of manufacturing the semiconductor structure can continue to complete formation of the IC. The method, for example, may continue to form additional higher ILD levels with interconnects, passivation layers and pad interconnects or bonding pads. Further processing can include final passivation, dicing, assembly and packaging. Other processes are also useful.

As described, the device includes one memory element. However, it is understood that a device may include numerous memory elements integrated into the same IC. Further, although the memory element as described in the present disclosure refers to the MTJ memory element of a MRAM cell, it is understood that other suitable elements may also be integrated using the techniques and processes as described herein.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A semiconductor structure comprising:
   a memory element disposed on a first metal layer;
   a first cap layer disposed on the first metal layer and sidewalls of the memory element;
   a first dielectric layer disposed on a top surface of the first cap layer on the first metal layer and a portion of the first cap layer on the sidewalls of the memory element;
   a second metal layer disposed on the first dielectric layer and sidewalls of the first cap layer;
   a second cap layer disposed on a top surface of the second metal layer;
   a second dielectric layer disposed on the second cap layer;
   a via in the second dielectric layer and exposes a top surface of the memory element; and
   a third metal layer disposed on the second dielectric layer and in the via.

2. The semiconductor structure according to claim 1, wherein the first metal layer is part of an interlevel dielectric level which corresponds to a first interlevel dielectric level.

3. The semiconductor structure according to claim 2, wherein the second metal layer on the first dielectric layer is part of an interlevel dielectric level which corresponds to a second interlevel dielectric level.

4. The semiconductor structure according to claim 3, wherein the third metal layer on the second dielectric layer and fills the via is part of an interlevel dielectric level which corresponds to a third interlevel dielectric level.

5. The semiconductor structure according to claim 1, wherein the first metal layer, the second metal layer and the third metal layer are independently selected from the group consisting of aluminum, tungsten, copper and cobalt.

6. The semiconductor structure according to claim 1, wherein the first dielectric layer and the second dielectric layer independently comprise a low-k dielectric material or an ultra low-k dielectric material.

7. The semiconductor structure according to claim 1, wherein the memory element is part of a magnetoresistive random-access memory device and includes a magnetic tunnel junction element formed between a top electrode and a bottom electrode.

8. The semiconductor structure according to claim 7, wherein the first metal layer, the second metal layer and the third metal layer are the same metal material.

9. The semiconductor structure according to claim 1, wherein the first cap layer has a thickness ranging from about 3 to about 20 nanometers (nm).

10. The semiconductor structure according to claim 1, which is a front-end-of-line device.

11. An integrated circuit comprising:
    one or more semiconductor structures, wherein one of the semiconductor structures comprises:
    a memory element disposed on a first metal layer;
    a first cap layer disposed on the first metal layer and sidewalls of the memory element;
    a first dielectric layer disposed on a top surface of the first cap layer on the first metal layer and a portion of the first cap layer on the sidewalls of the memory element;
    a second metal layer disposed on the first dielectric layer and sidewalls of the first cap layer;
    a second cap layer disposed on a top surface of the second metal layer;
    a second dielectric layer disposed on the second cap layer;
    a via in the second dielectric layer and exposes a top surface of the memory element; and
    a third metal layer disposed on the second dielectric layer and in the via.

12. The integrated circuit according to claim 11, wherein the first metal layer is part of an interlevel dielectric level which corresponds to a first interlevel dielectric level.

13. The integrated circuit according to claim 12, wherein the second metal layer on the first dielectric layer is part of an interlevel dielectric level which corresponds to a second interlevel dielectric level.

14. The integrated circuit according to claim 13, wherein the third metal layer on the second dielectric layer and fills the via is part of an interlevel dielectric level which corresponds to a third interlevel dielectric level.

15. The integrated circuit according to claim 11, wherein the first metal layer, the second metal layer and the third metal layer are independently selected from the group consisting of aluminum, tungsten, copper and cobalt.

16. The integrated circuit according to claim 11, wherein the first dielectric layer and the second dielectric layer independently comprise a low-k dielectric material or an ultra low-k dielectric material.

17. The integrated circuit according to claim 11, wherein the memory element is part of a magnetoresistive random-access memory device and includes a magnetic tunnel junction element formed between a top electrode and a bottom electrode.

18. The integrated circuit according to claim 17, wherein the first metal layer, the second metal layer and the third metal layer are the same metal material.

19. The integrated circuit according to claim 11, wherein the first cap layer has a thickness ranging from about 3 to about 20 nm.

20. The integrated circuit according to claim 1, wherein the semiconductor structure is a front-end-of-line device.

* * * * *